(12) United States Patent
Tanaka et al.

(10) Patent No.: US 11,152,334 B2
(45) Date of Patent: Oct. 19, 2021

(54) SEMICONDUCTOR DEVICE AND METHOD OF MANUFACTURING THE SAME

(71) Applicant: TOSHIBA MEMORY CORPORATION, Minato-ku (JP)

(72) Inventors: Yusuke Tanaka, Kawasaki (JP); Atsushi Hieno, Yokohama (JP); Tsutomu Nakanishi, Yokohama (JP); Yasuhito Yoshimizu, Yokkaichi (JP); Masayoshi Tagami, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/561,658

(22) Filed: Sep. 5, 2019

(65) Prior Publication Data

US 2020/0294971 A1 Sep. 17, 2020

(30) Foreign Application Priority Data

Mar. 15, 2019 (JP) .............................. JP2019-048964

(51) Int. Cl.
*H01L 25/065* (2006.01)
*H01L 23/00* (2006.01)
(Continued)

(52) U.S. Cl.
CPC .......... *H01L 25/0657* (2013.01); *H01L 24/03* (2013.01); *H01L 24/05* (2013.01); *H01L 24/08* (2013.01); *H01L 24/80* (2013.01); *H01L 25/18* (2013.01); *H01L 25/50* (2013.01); *H01L 2224/03464* (2013.01); *H01L 2224/05124* (2013.01); *H01L 2224/05144* (2013.01); *H01L 2224/05147* (2013.01); *H01L 2224/05149* (2013.01); *H01L 2224/05155* (2013.01); *H01L 2224/05164* (2013.01); *H01L 2224/05166* (2013.01); *H01L 2224/05169* (2013.01); *H01L 2224/05181* (2013.01);
(Continued)

(58) Field of Classification Search
None
See application file for complete search history.

(56) References Cited

U.S. PATENT DOCUMENTS 7,495,206 B2 2/2009 Park
9,343,369 B2 5/2016 Du et al.
(Continued)

FOREIGN PATENT DOCUMENTS

| JP | 5308616 B2 | 10/2013 |
|----|------------|---------|
| JP | 2017-521853 A | 8/2017 |
| JP | 2018-64758 A | 4/2018 |

*Primary Examiner* — Alexander G Ghyka
(74) *Attorney, Agent, or Firm* — Oblon, McClelland, Maier & Neustadt, L.L.P.

(57) ABSTRACT

In one embodiment, a semiconductor device includes a first chip that includes a first interconnect layer, a first insulator provided on the first interconnect layer, a first metal portion provided on the first interconnect layer and provided in the first insulator and including at least one of palladium, platinum and gold, and a second interconnect layer provided on the first metal portion and provided in the first insulator. The device further includes a second chip that includes a second insulator provided on the first insulator, and a third interconnect layer provided in the second insulator and provided on the second interconnect layer.

13 Claims, 12 Drawing Sheets

(51) Int. Cl.
　　　*H01L 25/00*　　　(2006.01)
　　　*H01L 25/18*　　　(2006.01)
(52) U.S. Cl.
　　　CPC ............... *H01L 2224/05184* (2013.01); *H01L 2224/08145* (2013.01); *H01L 2224/80895* (2013.01); *H01L 2225/06524* (2013.01); *H01L 2924/1431* (2013.01); *H01L 2924/14511* (2013.01)

(56) References Cited

U.S. PATENT DOCUMENTS

| | | | |
|---|---|---|---|
| 2013/0009315 A1* | 1/2013 | Colburn | ............ H01L 23/53295 257/774 |
| 2016/0225741 A1 | 8/2016 | Du et al. | |
| 2018/0233472 A1* | 8/2018 | Shih | ........................ H01L 21/56 |

* cited by examiner

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2019-048964, filed on Mar. 15, 2019, the entire contents of which are incorporated herein by reference.

FIELD

Embodiments described herein relate to a semiconductor device and a method of manufacturing the same.

BACKGROUND

When a semiconductor device is manufactured by bonding a metal pad of a wafer and a metal pad of another wafer, it is desired to form the metal pads suited for bonding.

DETAILED DESCRIPTION

In one embodiment, a semiconductor device includes a first chip that includes a first interconnect layer, a first insulator provided on the first interconnect layer, a first metal portion provided on the first interconnect layer and provided in the first insulator and including at least one of palladium, platinum and gold, and a second interconnect layer provided on the first metal portion and provided in the first insulator. The device further includes a second chip that includes a second insulator provided on the first insulator, and a third interconnect layer provided in the second insulator and provided on the second interconnect layer.

Embodiments will now be explained with reference to the accompanying drawings. Same reference signs are applied to same or similar components in FIGS. 1 to 16, and redundant explanations are to be omitted.

First Embodiment

Figure 1:
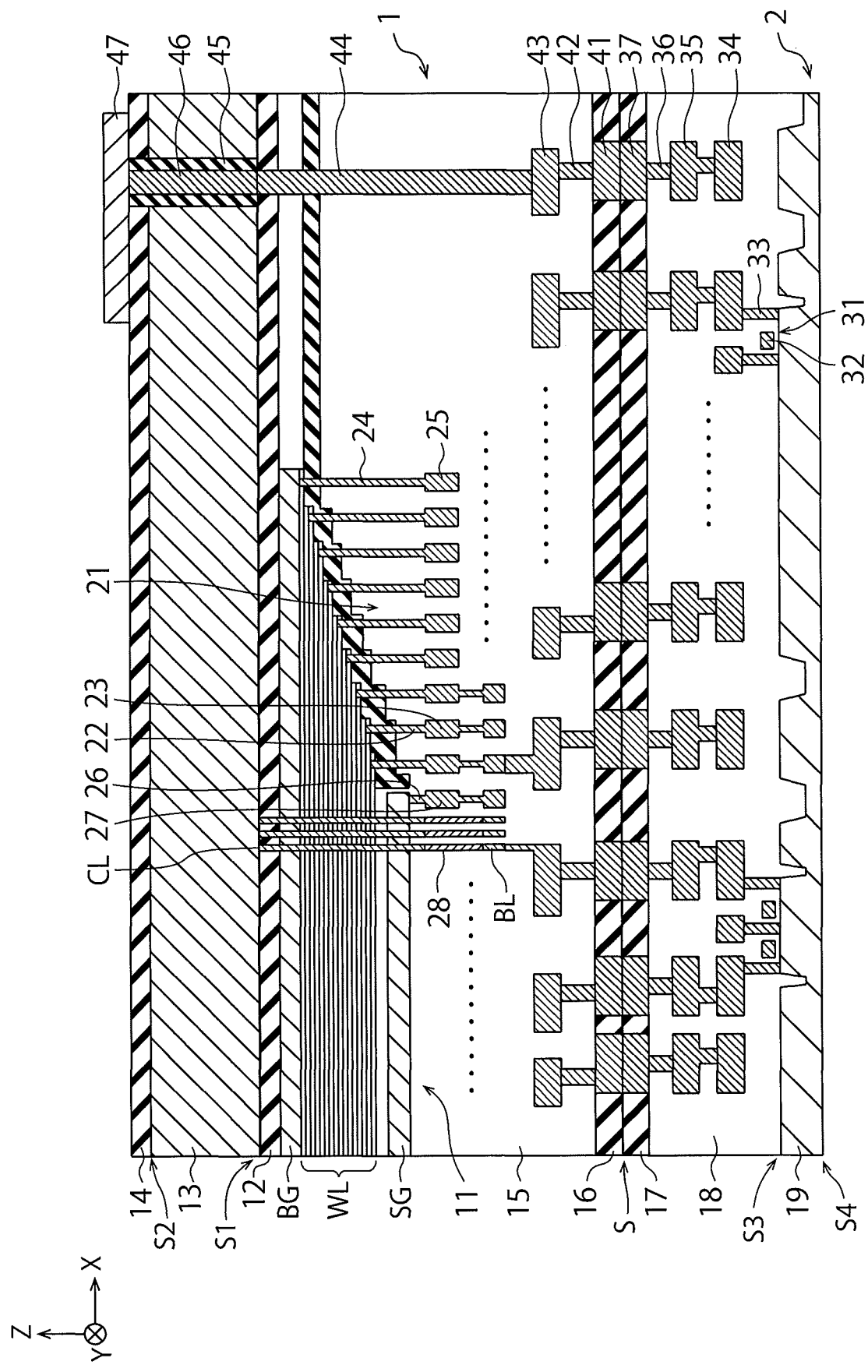
FIG. 1 is a cross-sectional view illustrating a structure of a semiconductor device of a first embodiment.

FIG. 1 is a cross-sectional view illustrating a structure of a semiconductor device of the first embodiment. The semiconductor device of FIG. 1 is a three-dimensional memory in which an array chip 1 and a circuit chip 2 are bonded.

The array chip 1 includes a memory cell array 11 including a plurality of memory cells, an insulator 12 on the memory cell array 11, a substrate 13 on the insulator 12, and an insulator 14 on the substrate 13. The array chip 11 further includes an inter-layer dielectric 15 under the memory cell array 11 and an insulator 16 under the inter-layer dielectric 15. The insulators 12, 14, and 16 are silicon oxide films or silicon nitride films, for example. The substrate 13 is a semiconductor substrate such as a silicon substrate, for example. The array chip 1 is an example of a second chip, and the substrate 13 is an example of a second substrate.

The circuit chip 2 is provided under the array chip 1. Reference sign "S" indicates a bonded face of the array chip 1 and the circuit chip 2. The circuit chip 2 includes an insulator 17, an inter-layer dielectric 18 under the insulator 17, and a substrate 19 under the inter-layer dielectric 18. The insulator 17 is a silicon oxide film or a silicon nitride film, for example. The substrate 19 is a semiconductor substrate such as a silicon substrate, for example. The circuit chip 2 is an example of a first chip, and the substrate 19 is an example of a first substrate.

FIG. 1 illustrates X-direction and Y-direction which are perpendicular to each other and in parallel to surfaces S1, S2 of the substrate 13 and surface S3, S4 of the substrate 19, and Z-direction that is perpendicular to the surfaces S1, S2 of the substrate 13 and the surfaces S3, S4 of the substrate 19. In this specification, +Z-direction is treated as an upper direction, and −Z-direction is treated as a lower direction. For example, the memory cell array 11 is located on an upper side of the substrate 19 and on a lower side of the substrate 13. −Z-direction may or may not be consistent with a gravity direction.

The array chip 1 includes a plurality of word lines WL, a back gate BG, and a selection gate SG as an electrode layer in the memory cell array 11. FIG. 1 illustrates a step-like structure portion 21 of the memory cell array 11. As illustrated in FIG. 1, each of the word lines WL is electrically connected to a word interconnect layer 23 via a contact plug 22, the back gate BG is electrically connected to a back gate interconnect layer 25 via a contact plug 24, and the selection gate SG is electrically connected to a selection gate interconnect layer 27 via a contact plug 26. A columnar portion CL piercing through the word lines WL, the back gate BG, and the selection gate SG is electrically connected to a bit line BL via a plug 28 and electrically connected to the substrate 13 as well.

The circuit chip 2 includes a plurality of transistors 31. Each of the transistors 31 includes a gate electrode 32 provided on the substrate 19 via a gate insulator, and a source diffusion layer as well as a drain diffusion layer, not shown, provided in the substrate 19. The circuit chip 2 further includes a plurality of plugs 33 provided on the source diffusion layer or the drain diffusion layer of those transistors 31, an interconnect layer 34 including a plurality of interconnects provided on those plugs 33, and an interconnect layer 35 including a plurality of interconnects provided on the interconnect layer 34. The circuit chip 2 further includes a plurality of via-plugs 36 provided on the interconnect layer 35, and a plurality of metal pads 37 provided on the via-plugs 36 in the insulator 17. The circuit chip 2 functions as a control circuit (logic circuit) that controls the array chip 1.

The array chip 1 includes a plurality of metal pads 41 provided on the metal pads 37 in the insulator 16, a plurality of via-plugs 42 provided on the metal pads 41, and an interconnect layer 43 including a plurality of interconnects provided on those via-plugs 42. Each of the word lines WL and each of the bit lines BL is electrically connected to the corresponding interconnects in the interconnect layer 43. The array chip 1 further includes a plug 44 provided in the inter-layer dielectric 15 and the insulator 12 and on the interconnect layer 43, a plug 46 provided in the substrate 13 and the insulator 14 via the insulator 45 and provided on the plug 44, and a pad 47 provided on the insulator 14 and on the plug 46. The pad 47 is an external connection pad of the semiconductor device illustrated in FIG. 1, and can be connected to a mounting board or another device via solder balls, metal bumps, wire bonding, or the like.

Figure 2:
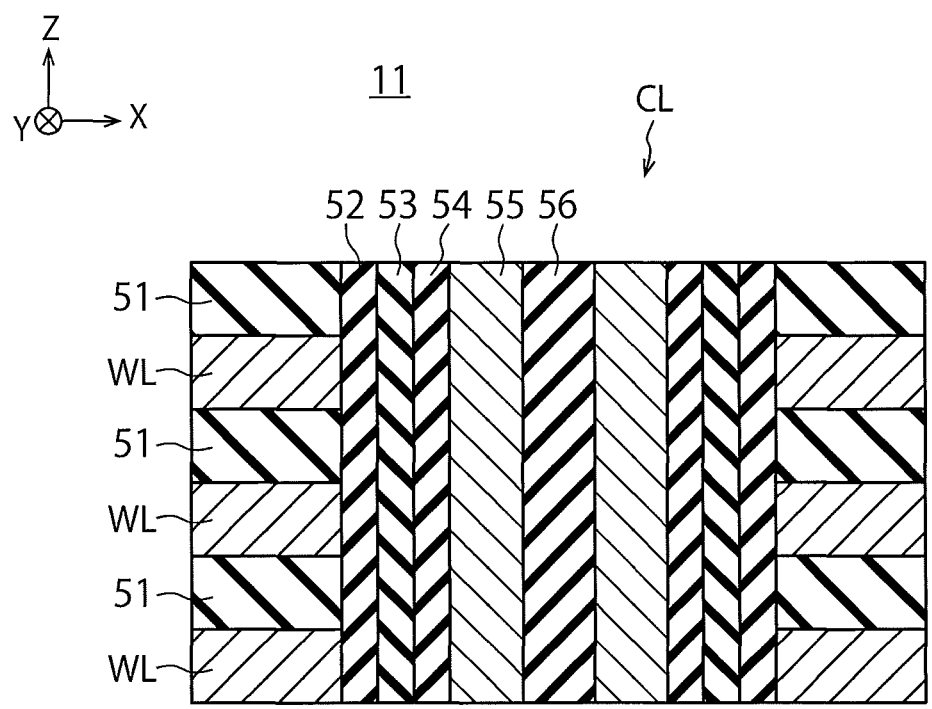
FIG. 2 is a cross-sectional view illustrating a structure of a columnar portion of the first embodiment.

FIG. 2 is a cross-sectional view illustrating a structure of the columnar portion CL of the first embodiment.

As illustrated in FIG. 2, the memory cell array 11 includes a plurality of word lines WL and a plurality of insulating layers 51 provided alternately on the inter-layer dielectric 15 (FIG. 1). Each of the word lines WL is a W (tungsten) layer, for example. Each of the insulating layers 51 is a silicon oxide film, for example.

The columnar portion CL includes a block insulator 52, a charge accumulation layer 53, a tunnel insulator 54, a channel semiconductor layer 55, and a core insulator 56 in order. The charge accumulation layer 53 is a silicon nitride film, for example, and formed on side faces of the word lines WL and the insulator 51 via the block insulator 52. The channel semiconductor layer 55 is a polysilicon layer, for example, and formed on a side face of the charge accumulation layer 53 via the tunnel insulator 54. The block insulator 52, the tunnel insulator 54, and the core insulator 56 are silicon oxide films or metal insulators, for example.

Figure 3:
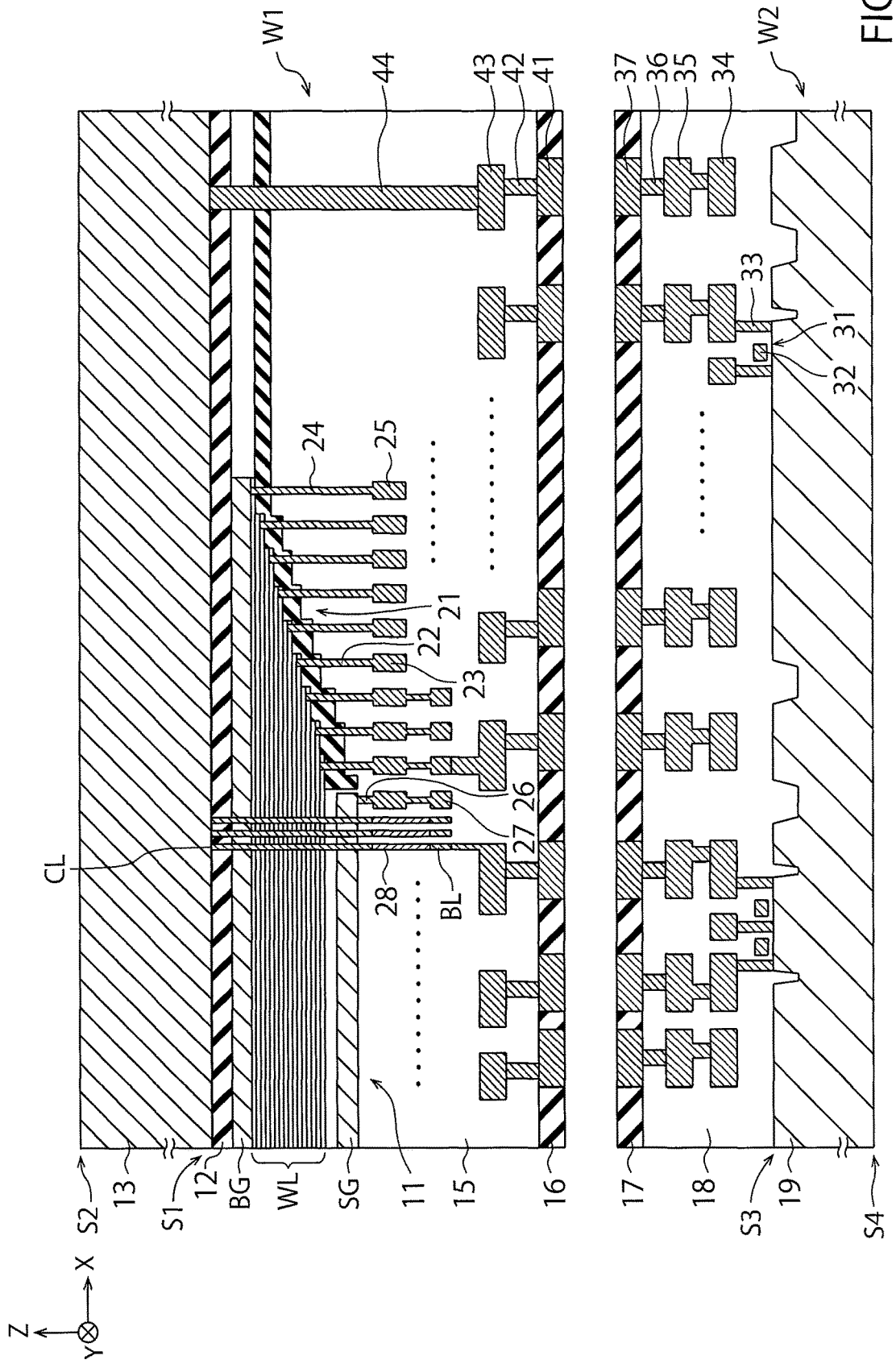
FIG. 3 is a cross-sectional view illustrating a method of manufacturing the semiconductor device of the first embodiment.

FIG. 3 is a cross-sectional view illustrating a method of manufacturing the semiconductor device of the first embodiment. FIG. 3 illustrates an array wafer W1 including a plurality of array chips 1 and a circuit wafer W2 including a plurality of circuit chips 2. The array wafer W1 is also referred to as a memory wafer, and the circuit wafer W2 is also referred to as a CMOS wafer.

First, the array wafer W1 and the circuit wafer W2 are bonded by applying mechanical pressure. Thereby, the insulator 16 is adhered to the insulator 17. Next, the array wafer W1 and the circuit wafer W2 are annealed at 400° C. Thereby, the metal pads 41 are joined to the metal pads 37. In this manner, the insulator 16 is bonded to the insulator 17, and the metal pads 41 are bonded to the metal pads 37.

Thereafter, the substrates 13 and 19 are thinned by CMP (Chemical Mechanical Polishing) and, then the array wafer W1 and the circuit wafer W2 are cut into a plurality of chips. In the manner described above, the semiconductor device of FIG. 1 is manufactured. The insulator 14, the insulator 45, the plug 46, and the pad 47 are formed on the substrate 13 or in the substrate 13 after thinning the substrate 13, for example.

While the array wafer W1 and the circuit wafer W2 are bonded in the embodiment, the array wafers W1 may be bonded to each other instead. Contents described by referring to FIG. 1 to FIG. 3 and contents described later by referring to FIG. 4 to FIG. 16 can be applied for bonding the array wafers W1 with each other.

Furthermore, while FIG. 1 illustrates a boundary face between the insulator 16 and the insulator 17 and boundary faces between the metal pads 41 and the metal pads 37, those boundary faces normally become unobservable after the annealing described above. However, it is possible to estimate the positions of those boundary faces through detecting tilt of the side faces of the metal pads 41 and the metal pads 37 or detecting position shift between the side faces of the metal pads 41 and the metal pads 37, for example.

While the insulator 16 is formed on the bottom face of the inter-layer dielectric 15 in FIG. 1 and FIG. 3, the insulator 16 may be included and integrated with the inter-layer dielectric 15. Similarly, while the insulator 17 is formed on the top face of the inter-layer dielectric 18 in FIG. 1 and FIG. 3, the insulator 17 may be included and integrated with the inter-layer dielectric 18. In FIGS. 4 to 16 to be described later, the insulator 16 is included and integrated with the inter-layer dielectric 15 and the insulator 17 is included and integrated with the inter-layer dielectric 18, so that reference numerals "16" and "17" are not applied. In FIG. 4 to FIG. 16, however, the insulator 16 may also be formed on the bottom face of the inter-layer dielectric 15 and the insulator 17 may also be formed on the top face of the inter-layer dielectric 18.

Figure 4:
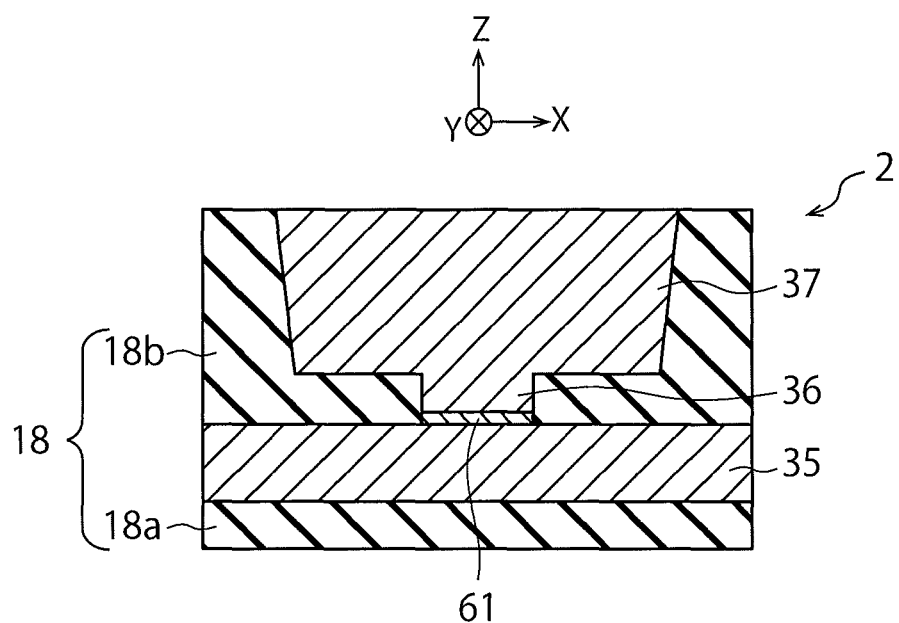
FIG. 4 is a cross-sectional view illustrating a structure of a metal pad of the first embodiment.

FIG. 4 is a cross-sectional view illustrating a structure of the metal pad 37 of the first embodiment and, specifically, illustrates a structure of a single metal pad 37 in the circuit chip 2 and the vicinity thereof.

FIG. 4 illustrates an insulator 18a forming the inter-layer dielectric 18, the interconnect layer 35, another insulator 18b forming the inter-layer dielectric 18, a catalyst layer 61, the via-plug 36, and the metal pad 37. The interconnect layer 35 is an example of a first interconnect layer, and the insulator 18b is an example of a first insulator. The catalyst layer 61 is an example of a first metal portion, and the via-plug 36 and the metal pad 37 are examples of a second interconnect layer.

The insulator 18a, the interconnect layer 35, and the insulator 18b are formed on the upper side of the above-described substrate 19 in order. The insulator 18a is a silicon oxide film, for example. The interconnect layer 35 is a metal layer including a Cu (copper) layer, a W (tungsten) layer, or an Al (aluminum) layer, for example, and it is a W layer herein. The insulator 18b is a silicon oxide film or a TEOS (tetraethyl orthosilicate) film, for example.

The catalyst layer 61 is formed on the interconnect layer 35 in the insulator 18b. The catalyst layer 61 is a Pd (palladium) layer, a Pt (platinum) layer, or an Au (gold) layer, for example, and it is a Pd layer herein. The catalyst layer 61 functions as a catalyst for growing the via-plug 36 and the metal pad 37 on the upper side of the interconnect layer 35 by electroless plating. Instead of forming the catalyst layer 61 on the interconnect layer 35, a catalyst may be formed on the interconnect layer 35 in a form other than a layer. For example, a plurality of particles including a catalyst may be formed on the interconnect layer 35. Those particles are an example of the first metal portion. This is also the same for a catalyst layer 62 to be described later.

The via-plug 36 and the metal pad 37 are formed in order on the catalyst layer 61 in the insulator 18b. Specifically, the via-plug 36 is formed on the upper side of the interconnect layer 35 via the catalyst layer 61. Furthermore, the metal pad 37 is formed on the upper side of the interconnect layer 35 via the catalyst layer 61 and the via-plug 36, and also formed on the upper side of the interconnect layer 35 via the insulator 18b. The via-plug 36 is an example of a first region, and the metal pad 37 is an example of a second region.

The via-plug 36 and the metal pad 37 are metal layers including Cu layers, for example, and those are Cu layers herein. The via-plug 36 and the metal pad 37 of the embodiment are formed on the upper side of the interconnect layer 35 via the catalyst layer 61 by electroless plating using the catalyst layer 61 as a catalyst. In the embodiment, the via-plug 36 and the metal pad 37 as the Cu layers are formed on the upper side of the interconnect layer 35 as the W layer.

As described above, the semiconductor device of the embodiment is a three-dimensional memory in which the array chip 1 and the circuit chip 2 are bonded (FIG. 1). Thereby, the insulator 18b in the circuit chip 2 of FIG. 4 is bonded to the inter-layer dielectric 15 (or the insulator 16) in the array chip 1. The inter-layer dielectric 15 (or the insulator 16) is an example of a second insulator. Furthermore, the metal pad 37 in the circuit chip 2 of FIG. 4 is bonded to the metal pad 41 in the array chip 1. The metal pad 41 is an example of a third interconnect layer. The relation between the metal pad 37 and the metal pad 41 will be described later in more detail.

Figure 5:
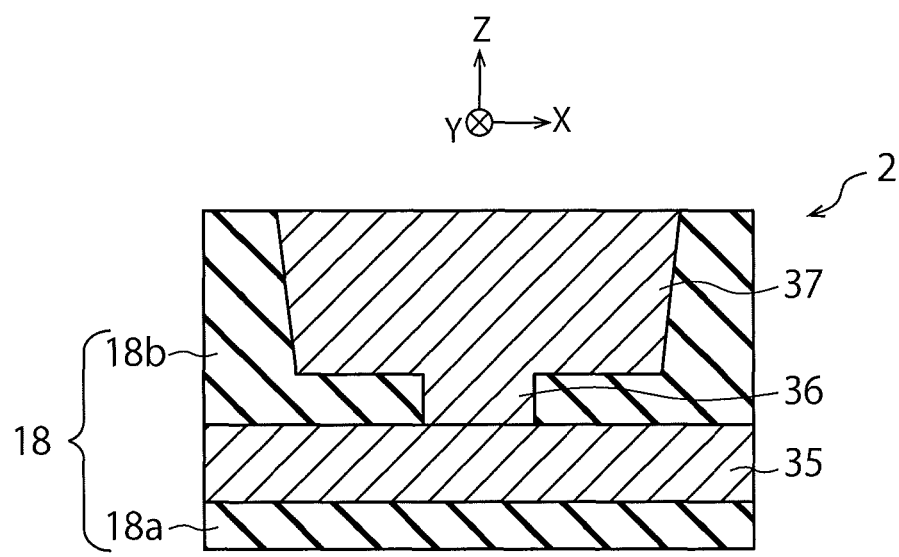
FIG. 5 is a cross-sectional view illustrating a structure of a metal pad of a modification of the first embodiment.

FIG. 5 is a cross-sectional view illustrating a structure of the metal pad 37 according a modification of the first embodiment.

In the modification, the via-plug 36 and the metal pad 37 are Cu layers, and the interconnect layer 35 is also a Cu layer. When those are formed with a same metal material as described above, the via-plug 36 and the metal pad 37 can be formed on the interconnect layer 35 by electroless plating without using the catalyst layer 61. Therefore, with the modification, the catalyst layer 61 may or may not be formed on the interconnect layer 35. FIG. 5 illustrates an example where the catalyst layer 61 is not formed on the interconnect layer 35.

FIGS. 6A to 7B are cross-sectional views illustrating the method of manufacturing the semiconductor device of the first embodiment.

Figure 6A:
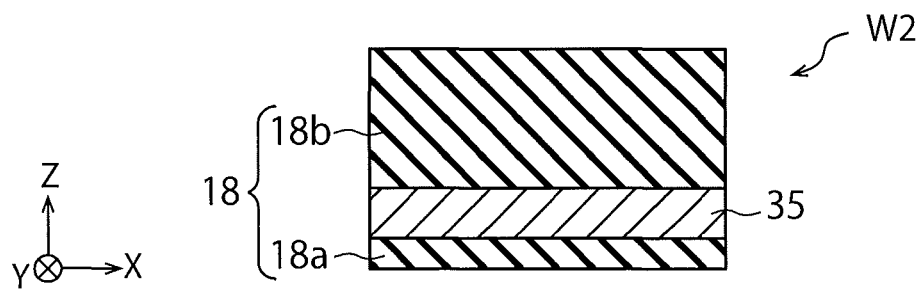
FIGS. 6A to 7B are cross-sectional views illustrating the method of manufacturing the semiconductor device of the first embodiment.

First, on the upper side of the substrate 19 described above, the insulator 18a, the interconnect layer 35, and the insulator 18b are formed in order (FIG. 6A). The interconnect layer 35 is a W layer, for example.

Figure 6B:
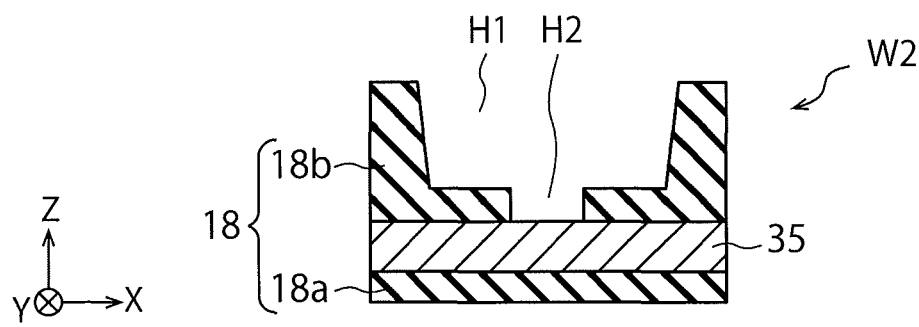

Next, holes H1 and H2 are formed in order in the insulator 18 by RIE (Reactive Ion Etching) (FIG. 6B). The hole H1 has a depth of about 0.5 to 1.0 μm, for example, and used for embedding the metal pad 37. The hole H2 is formed to be piercing through the insulator 18b on the bottom of the hole H1. The hole H2 has a depth of about 0.1 to 0.5 μm, for example, and used for embedding the via-plug 36 and the catalyst layer 61.

Figure 6C:
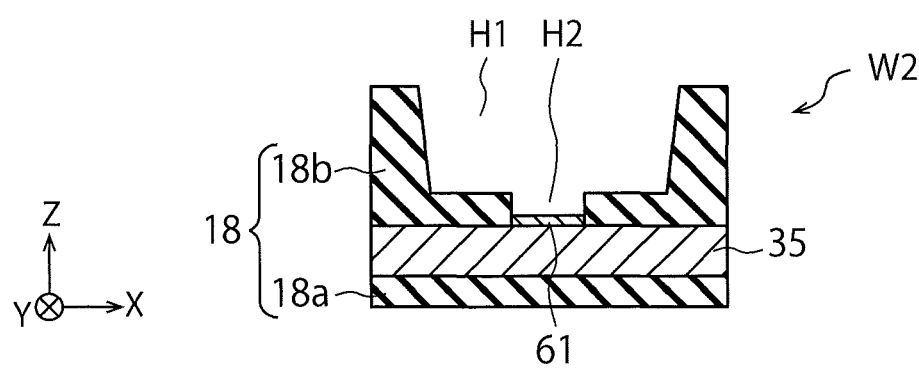

Then, the catalyst layer 61 is formed on the interconnect layer 35 in the hole H2 (FIG. 6C). The catalyst layer 61 is a Pd layer, for example. The catalyst layer 61 of the embodiment is selectively formed on the top face of the interconnect layer 35 in the hole H2.

Figure 7A:
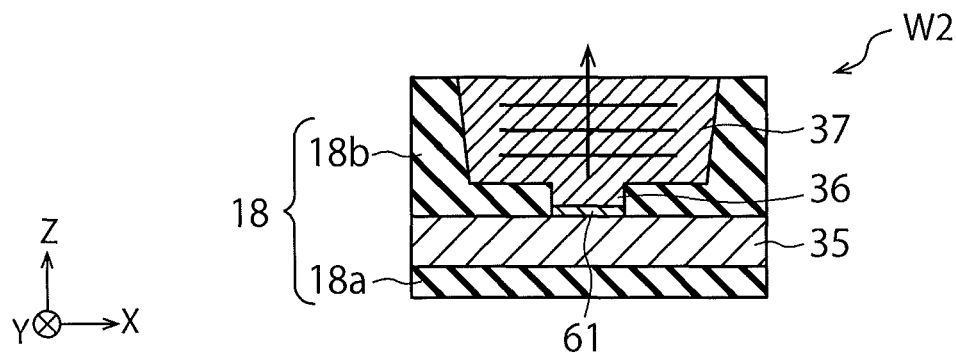

Then, a metal layer (electroless plating layer) is grown on the upper side of the interconnect layer 35 via the catalyst layer 61 by electroless plating using the catalyst layer 61 as a catalyst. The electroless plating layer is a Cu layer, for example, and formed inside and outside the holes H1 and H2. Then, the surface of the plating layer is flattened by CMP to remove the plating layer outside the holes H1 and H2. In this manner, the via-plug 36 and the metal pad 37 are formed with the plating layer in the holes H1 and H2, respectively (FIG. 7A). The plating layer may include Cu and metallic element other than Cu. For example, the plating layer may include at least either Ni (nickel) or Mn (manganese). When both the interconnect layer 35 and the plating layer are Cu layers, a step of forming the catalyst layer 61 illustrated in FIG. 6C may be omitted.

In general, in a case of forming the plating layer in the holes H1 and H2 by electro plating, the plating layer starts to be formed from the bottom faces and side faces of the holes H1 and H2 and, thereafter, the plating layer is formed toward the center portion of the holes H1 and H2. That is, the plating layer is formed conformally with electro plating.

In the meantime, in a case of forming the plating layer in the holes H1 and H2 by electroless plating as in the embodiment, it is possible to form the plating layer in a mode where the top face of the plating layer is gradually raised as illustrated by an arrow in FIG. 7A. That is, with the embodiment, the plating layer can be formed nonconformally by electroless plating. Details of electroless plating will be described later.

In the manner described above, the circuit wafer W2 of the embodiment is manufactured. In the embodiment, the array wafer W1 is also manufactured in a similar method. Then, the array wafer W1 and the circuit wafer W2 are bonded by applying mechanical pressure and annealing (FIG. 7B).

Figure 7B:
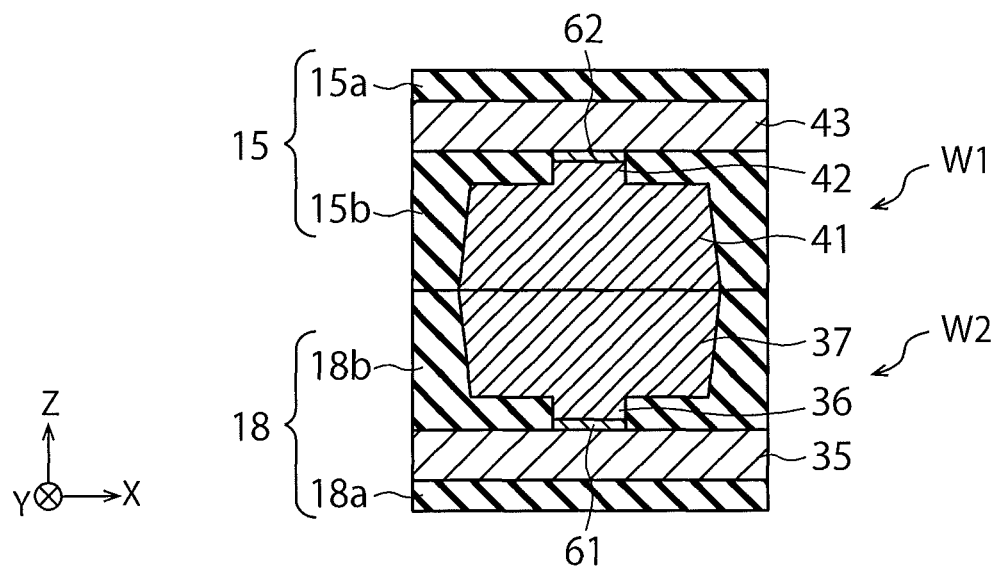

As illustrated in FIG. 7B, the array wafer W1 indicates an insulator 15a forming the inter-layer dielectric 15, the interconnect layer 43, another insulator 15b forming the inter-layer dielectric 15, the catalyst layer 62, the via-plug 42, and the metal pad 41. The interconnect layer 43 is an example of a fourth interconnect layer, and the insulator 15b is an example of the second insulator. The catalyst layer 62 is an example of a second metal portion, and the via-plug 42 and the metal pad 41 are examples of the third interconnect layer.

The insulator 15a, the interconnect layer 43, the insulator 15b, the catalyst layer 62, the via-plug 42, and the metal pad 41 can be formed on the substrate 13 by a similar method, layout, and materials as those of the insulator 18a, the interconnect layer 35, the insulator 18b, the catalyst layer 61, the via-plug 36, and the metal pad 37, respectively. Therefore, the interconnect layer 43 is a W layer, for example, the catalyst layer 62 is a Pd layer, for example, and the via-plug 42 and the metal pad 41 are Cu layers, for example. The via-plug 42 and the metal pad 41 of the embodiment are formed on the surface of the interconnect layer 43 via the catalyst layer 62 by electroless plating using the catalyst layer 62 as a catalyst. With the step of FIG. 7B, the insulator 15b is bonded to the insulator 18b, and the metal pad 41 is bonded to the metal pad 37.

Thereafter, the array wafer W1 and the circuit wafer W2 are cut into a plurality of chips. In the manner described above, the semiconductor device of the embodiment is manufactured.

Figure 8:
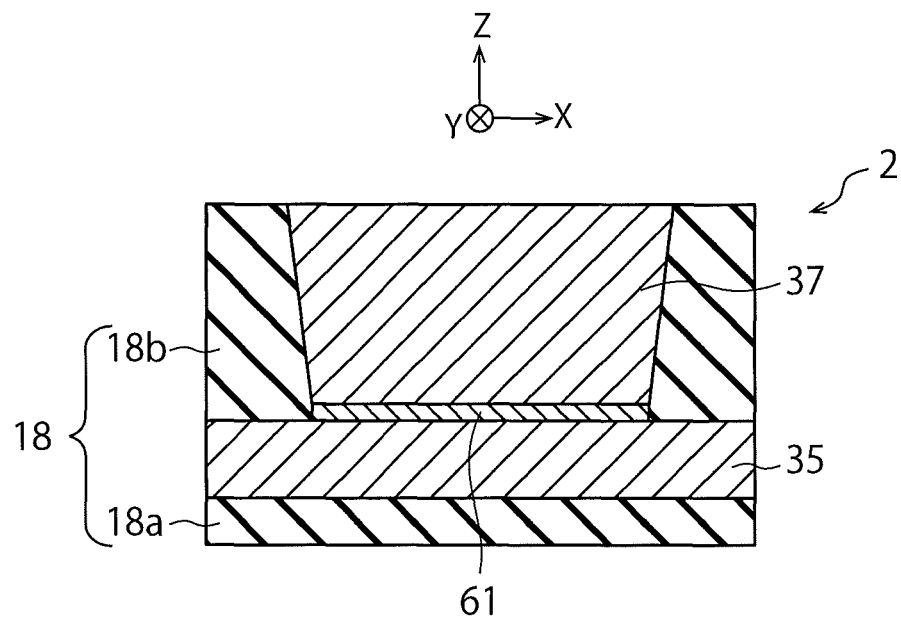
FIG. 8 is a cross-sectional view illustrating a structure of a metal pad of another modification of the first embodiment.

FIG. 8 is a sectional view illustrating a structure of the metal pad 37 of another modification of the first embodiment.

The semiconductor device of FIG. 8 has a structure in which the via-plug 36 is removed from the semiconductor device of FIG. 4. In the modification, the interconnect layer 35 is a W layer, for example, and the metal pad 37 is a Cu layer, for example. In this case, the metal pad 37 may be formed directly on the catalyst layer 61.

Figure 9:
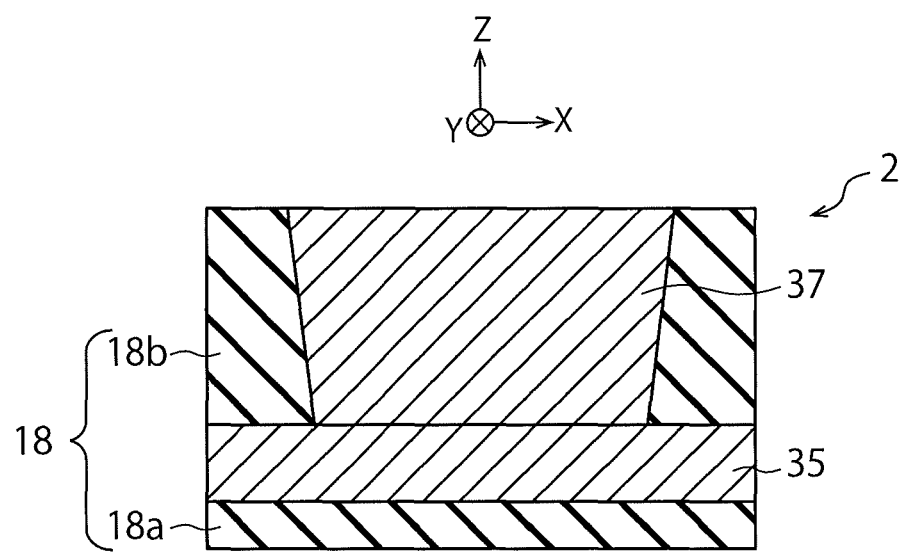
FIG. 9 is a cross-sectional view illustrating a structure of a metal pad of still another modification of the first embodiment.

FIG. 9 is a cross-sectional view illustrating a structure of the metal pad 37 of still another modification of the first embodiment.

The semiconductor device of FIG. 9 has a structure in which the via-plug 36 is removed from the semiconductor device of FIG. 5. In the modification, the interconnect layer 35 is a Cu layer, for example, and the metal pad 37 is a Cu layer, for example. In this case, the metal pad 37 may be formed directly on the interconnect layer 35.

Hereinafter, details of electroless plating of the embodiment will be described.

In the embodiment, the via-plug 26 and the metal pad 37 are formed by forming the plating payer in the holes H1 and H2 through electroless plating. Thereby, the plating layer can be formed nonconformally in the holes H1 and H2 (FIG. 7A).

In the meantime, in a case of forming the plating layer in the holes H1 and H2 by electro plating, the plating layer is formed conformally in the holes H1 and H2. In such case, the plating layer is formed simultaneously inside and outside the holes H1 and H2, so that a great amount of plating layer is formed outside the holes H1 and H2. The plating layer outside the holes H1 and H2 is removed at last by CMP, so that a waste of plating layer is increased when a great amount of plating layer is formed outside the holes H1 and H2. Furthermore, it is necessary to apply an electric field to the circuit wafer W2 when performing electro plating, which requires a lot of effort and cost for applying the electric field.

With the embodiment, it is possible to overcome such issue. With the embodiment, the plating layer is formed by electroless plating, so that the plating layer can be formed without applying an electric field to the circuit wafer W2. Furthermore, with the embodiment, the plating layer can be formed nonconformally in the holes H1 and H2 by electroless plating. In such case, the plating layer is formed in the holes H1 and H2, and formed outside the holes H1 and H2 thereafter. Therefore, it is possible to avoid forming a great amount of plating layer outside the holes H1 and H2. This makes it possible to reduce a waste of the plating layer.

Furthermore, there may be a case where it is desirable for the metal pad 37 to be formed thick to some extent in order to properly bond the metal pad 37 and the metal pad 41, for example. When the metal pad 37 is formed thick, however, voids in the metal pad 37 as well as steps on the surface of the metal pad 37 are easily formed, and a waste of the plating layer is increased.

Regarding such issue, the plating layer is embedded in the center portion of the holes H1 and H2 at last when the plating layer is formed conformally. Therefore, voids are easily generated in the center portion of the holes H1 and H2. Also, since the plating layer is embedded in the center portion of the holes H1 and H2 lastly when the plating layer is formed conformally, steps are easily generated between the center portions of the holes H1, H2 and peripheral portions. In addition, when the plating layer is formed conformally, a waste of the plating layer is increased as described above.

In the meantime, with the embodiment, it becomes possible to simultaneously embed the plating layer in the center portion and the peripheral portion in same height through forming the plating layer nonconformally by electroless plating. This makes it possible to suppress generation of voids and steps. In addition, when the plating layer is formed nonconformally, a waste of the plating layer can be reduced as described above.

As described above, in the embodiment, the metal pad 37 is formed on the upper side of the interconnect layer 35 by electroless plating. Therefore, with the embodiment, it becomes possible to provide the metal pad 37 suited for bonding. For example, the metal pad 37 thick in film thickness with less voids and steps can be formed while reducing a waste of the plating layer. This is also the same for the metal pad 41.

Second Embodiment

Figure 10:
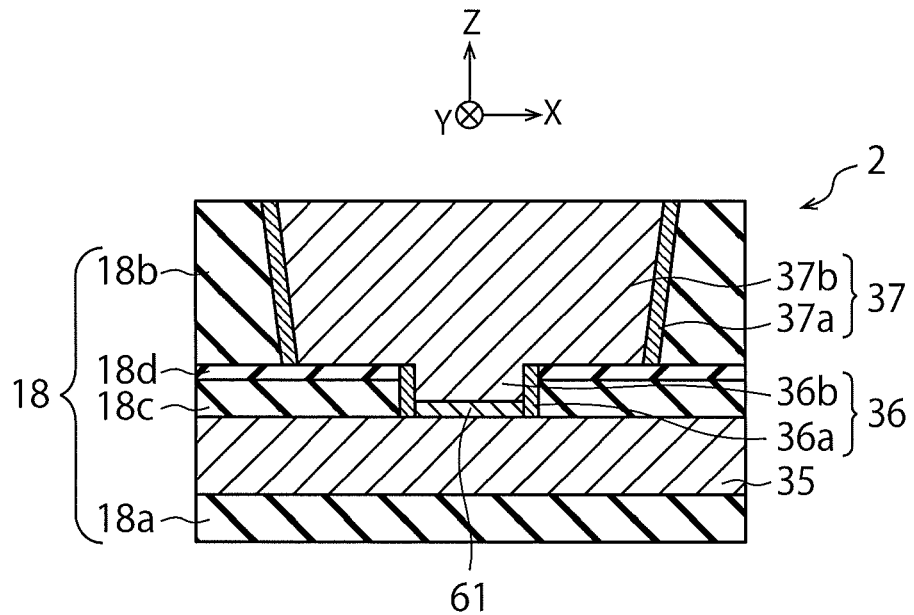
FIG. 10 is a cross-sectional view illustrating a structure of a metal pad of a second embodiment.

FIG. 10 is a cross-sectional view illustrating a structure of the metal pad 37 of a second embodiment.

The cross section of FIG. 10 of the embodiment corresponds to the cross section of FIG. 4 of the first embodiment. Note, however, that the inter-layer dielectric 18 of the embodiment includes insulators 18c, 18d in addition to the insulators 18a, 18b. Also, the via-plug 36 of the embodiment includes a barrier metal layer 36a and a plug material layer 36b. Furthermore, the metal pad 37 of the embodiment includes a barrier metal layer 37a and a pad material layer 37b. The insulators 18b, 18c, and 18d are examples of the second insulator. The barrier metal layer 36a and the barrier metal layer 37a are examples of a first film. The plug material layer 36b and the pad material layer 37b are examples of a second film.

The insulator 18c, 18d, and 18b are formed on the interconnect layer 35 in order. The insulator 18c is a silicon oxide film, for example, the insulator 18d is a silicon nitride film, for example, and the insulator 18d is a silicon oxide film or a TEOS film, for example. Furthermore, the interconnect layer 35 is a metal layer including a Cu layer, a W layer, or an AL layer, for example, and it is a W layer herein.

The via-plug 36 is formed on the catalyst layer 61 in the insulators 18c and 18d, and includes the barrier metal layer 36a and the plug material layer 36b. The barrier metal layer 36a is formed on the side faces of the insulators 18c and 18d. The barrier metal layer 36a is a titanium (Ti) layer, a tantalum (Ta) layer, a manganese (Mn) layer, a titanium nitride film, a tantalum nitride film, a manganese nitride film, a titanium oxide film, a tantalum oxide film, or a manganese oxide film, for example, and it is a titanium layer herein. As will be described later, the barrier metal layer 36a is formed before forming the catalyst layer 61, so that the catalyst layer 61 is formed to be surrounded by the barrier metal layer 36a in an annular shape. The plug material layer 36b is formed in the insulators 18c and 18d via the barrier metal layer 36a, and also formed on the interconnect layer 35 via the catalyst layer 61. The plug material layer 36b is formed to be in contact with the catalyst layer 61. The plug material layer 36b is a metal layer including a Cu layer, for example, and it is a Cu layer herein.

The metal pad 37 is formed on the via-plug 36 in the insulator 18b, and includes the barrier metal layer 37a and the pad material layer 37b. The barrier metal layer 37a is formed on the side face of the insulator 18b. The barrier metal layer 37a is a titanium layer, a tantalum layer, a manganese layer, a titanium nitride film, a tantalum nitride film, a manganese nitride film, a titanium oxide film, a tantalum oxide film, or a manganese oxide film, for example, and it is a titanium layer herein. The pad material layer 37b is formed in the insulator 18b via the barrier metal layer 37a, and also formed on the interconnect layer 35 via the catalyst layer 61 and the plug material layer 36b. The pad material layer 37b is a metal layer including a Cu layer, for example, and it is a Cu layer herein.

As described, in the embodiment, the plug material layer 36b and the pad material layer 37b as the CU layers are formed on the upper side of the interconnect layer 35 as the W layer. The plug material layer 36b and the pad material layer 37b of the embodiment are formed on the upper side of the interconnect layer 35 via the catalyst layer 61 by electroless plating using the catalyst layer 61 as a catalyst.

Figure 11:
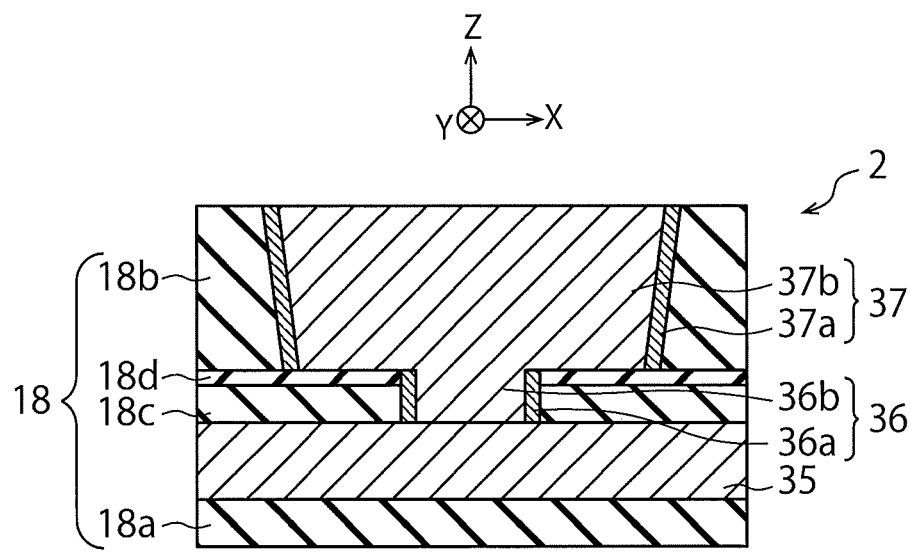
FIG. 11 is a cross-sectional view illustrating a structure of a metal pad of a modification of the second embodiment.

FIG. 11 is a cross-sectional view illustrating a structure of the metal pad 37 of a modification of the second embodiment.

In the modification, the plug material layer 36b and the pad material layer 37b are Cu layers, and the interconnect layer 35 is also a Cu layer. When those are formed with a same metal material as in this case, it is possible to form the plug material layer 36b and the pad material layer 37b on the interconnect layer 35 by electroless plating without using the catalyst layer 61. Therefore, in the modification, the catalyst layer 61 may or may not be formed on the interconnect layer 35. FIG. 11 illustrates an example where the catalyst layer 61 is not formed on the interconnect layer 35.

FIG. 12A to 13C are cross-sectional views illustrating a method of manufacturing the semiconductor device of the second embodiment.

Figure 12A:
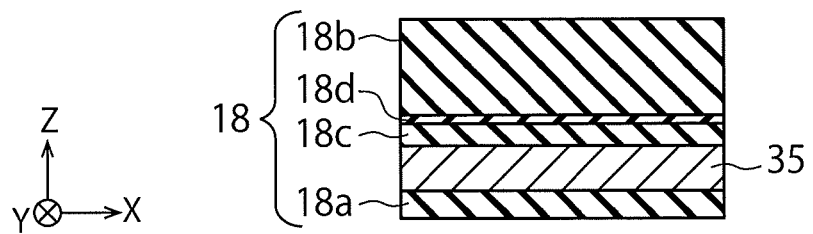
FIGS. 12A to 13C are cross-sectional views illustrating a method of manufacturing the semiconductor device of the second embodiment.

First, on the upper side of the substrate 19 described above, the insulator 18a, the interconnect layer 35, the insulator 18c, the insulator 18d, and the insulator 18b are formed in order (FIG. 12A). The interconnect layer 35 is a W layer, for example.

Figure 12B:
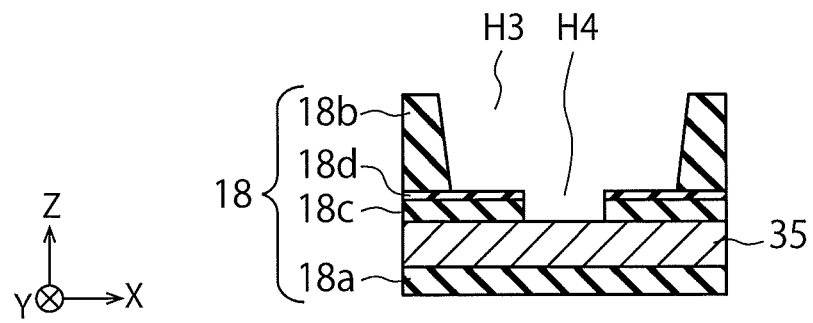

Next, a hole H3 is formed in the insulator 18b by RIE and, furthermore, a hole H4 is formed in the insulators 18d and 18c by RIE (FIG. 12B). The hole H3 is formed to be piercing through the insulators 18b. The hole H3 has a depth of about 0.5 to 1.0 µm, for example, and used for embedding the metal pad 37. The hole H4 is formed to be piercing through the insulators 18d and 18c on the bottom of the hole H3. The hole H4 has a depth of about 0.1 to 0.5 µm, for example, and used for embedding the via-plug 36 and the catalyst layer 61.

Figure 12C:
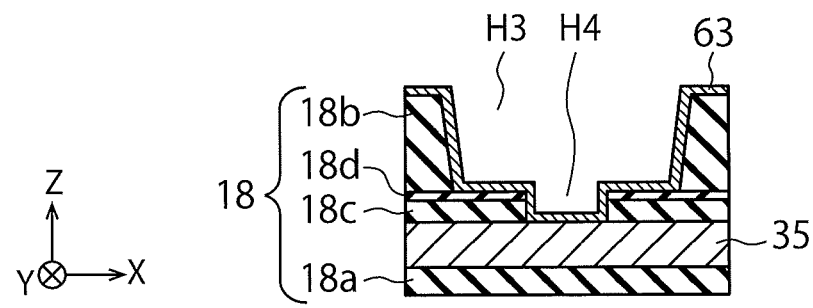

Then, on the whole surface of the substrate 19, a barrier metal layer 63 for forming the barrier metal layers 36a and 37b is formed conformally (FIG. 12C). As a result, the barrier metal layer 63 is formed on the side faces and the bottom face of the hole H3 as well as the side faces and the bottom face of the hole H4. The barrier metal layer 63 is a Ti layer, for example.

Figure 13A:
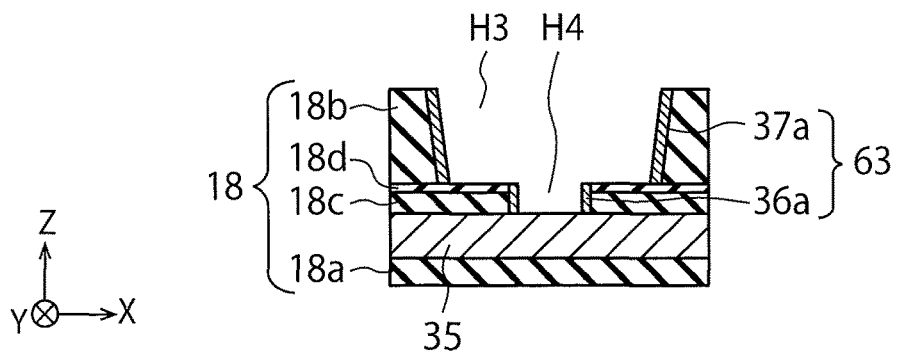
Figure 13B:
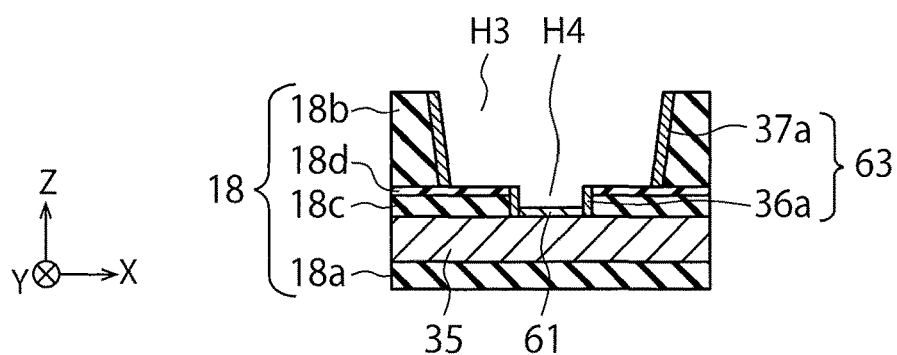

Then, the barrier metal layer 63 is removed from the bottom face of the hole H4 through anisotropic etching such as RIE (FIG. 13A). As a result, the top face of the interconnect layer 35 is exposed in the hole H4. With this anisotropic etching, the barrier metal layer 63 is removed also from the bottom face of the hole H3. As a result, the barrier metal layer 63 is sectioned into the barrier metal layer 36a and the barrier metal layer 37a, and the top face of the insulator 18d is exposed in the hole H3. The insulator 18d is a silicon nitride film, so that it has a function of preventing diffusion of Cu atoms like a titanium nitride film, a tantalum nitride film and a manganese nitride film. That is, the insulator 18d has a similar diffusion preventing function as those of the barrier metal layers 36a and 37a.

Figure 13C:
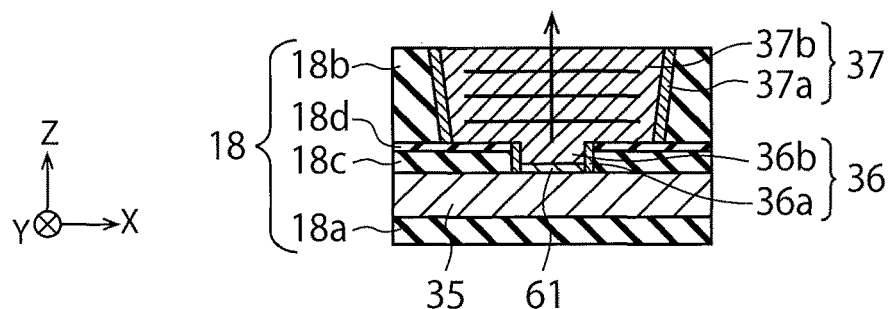

Then, the catalyst layer 61 is formed on the interconnect layer 35 in the hole H4 (FIG. 13C). The catalyst layer 61 is a Pd layer, for example. The catalyst layer 61 of the embodiment is selectively formed on the top face of the interconnect layer 35 in the hole H4.

Then, a metal layer (electroless plating layer) is grown on the upper side of the interconnect layer 35 via the catalyst layer 61 by electroless plating using the catalyst layer 61 as a catalyst. The electroless plating layer is a Cu layer, for example, and formed inside and outside the holes H3 and H4. Then, the surface of the plating layer is flattened by CMP to remove the plating layer outside the holes H3 and H4. In this manner, the plug material layer 36b and the pad material layer 37b are formed with the plating layer in the holes H3 and H4, respectively (FIG. 13C). When both the interconnect layer 35 and the plating layer are Cu layers, the step of forming the catalyst layer 61 illustrated in FIG. 13B may be omitted.

In the embodiment, the barrier metal layers 36a and 37a are formed on the side faces of the holes H3 and H4, so that it is seemingly considered that the plating layer is grown from the surfaces of the barrier metal layers 36a and 37a. However, the barrier metal layers 36a and 37a of the embodiment are titanium layers, and at least the surface of the titanium layer is changed to a titanium oxide film due to oxidation before the step of FIG. 13C is performed. Therefore, normally, the plating layer is not grown from the surfaces of the barrier metal layers 36a and 37a of the embodiment. Accordingly, when the plating layer is formed by electroless plating in the holes H3 and H4 in the embodiment, it is possible to form the plating layer in a mode where the top face of the plating layer is gradually raised as illustrated by an arrow in FIG. 13A. That is, with the embodiment, the plating layer can be formed nonconformally through electroless plating.

In the manner described above, the circuit wafer W2 of the embodiment is manufactured. In the embodiment, the array wafer W1 is also manufactured in a similar method. Then, the array wafer W1 and the circuit wafer W2 are bonded by applying mechanical pressure and annealing as in the step of FIG. 7B described above.

In the embodiment, as in the case of the first embodiment, the insulator 15, the interconnect layer 43, the catalyst layer 62, the via-plug 42, and the metal pad 41 can be formed on the substrate 13 by a similar method, layout, and materials as those of the insulator 18, the interconnect layer 35, the catalyst layer 61, the via-plug 36, and the metal pad 37, respectively. Through bonding the array wafer W1 and the circuit wafer W2, the insulator 15 is bonded to the insulator 18, and the metal pad 41 is bonded to the metal pad 37.

Thereafter, the array wafer W1 and the circuit wafer W2 are cut into a plurality of chips. In the manner described above, the semiconductor device of the embodiment is manufactured.

Figure 14:
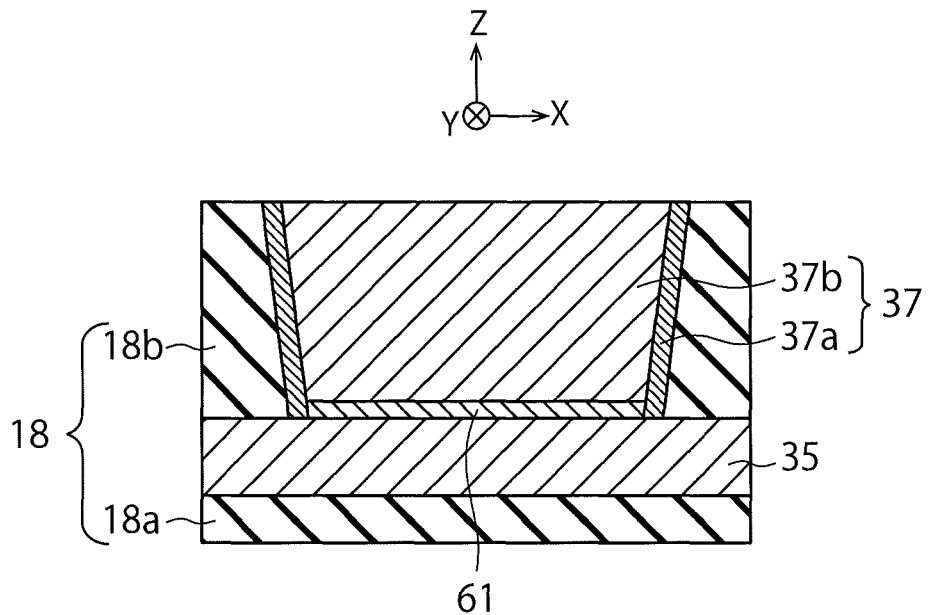
FIG. 14 is a cross-sectional view illustrating a structure of a metal pad of another modification of the second embodiment.

FIG. 14 is a sectional view illustrating a structure of the metal pad 37 of another modification of the second embodiment.

The semiconductor device of FIG. 14 has a structure in which the via-plug 36 is removed from the semiconductor device of FIG. 10. In the modification, the interconnect layer 35 is a W layer, for example, and the pad material layer 37b is a Cu layer, for example. In this case, the pad material layer 37b may be formed directly on the catalyst layer 61.

Figure 15:
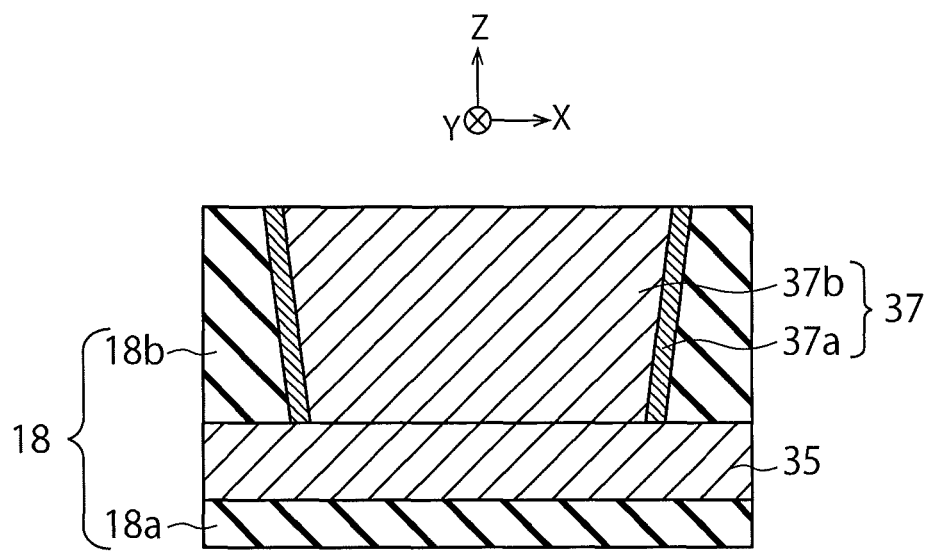
FIG. 15 is a cross-sectional view illustrating a structure of a metal pad of still another modification of the second embodiment.

FIG. 15 is a cross-sectional view illustrating a structure of the metal pad 37 of still another modification of the second embodiment.

The semiconductor device of FIG. 15 has a structure in which the via-plug 36 is removed from the semiconductor device of FIG. 11. In the modification, the interconnect layer 35 is a Cu layer, for example, and the pad material layer 37b is a Cu layer, for example. In this case, the pad material layer 37b may be formed directly on the interconnect layer 35.

As described above, in the embodiment, the pad material layer 37b is formed on the upper side of the interconnect layer 35 by electroless plating. Therefore, with the embodiment, it becomes possible to provide the metal pad 37 suited for bonding even in the case of forming the barrier metal layer 37a. For example, as in the case of the first embodiment, the pad material layer 37b thick in film thickness with less voids and steps can be formed while reducing a waste of the plating layer. This is also the same for the pad material layer of the metal pad 41.

Third Embodiment

Figure 16:
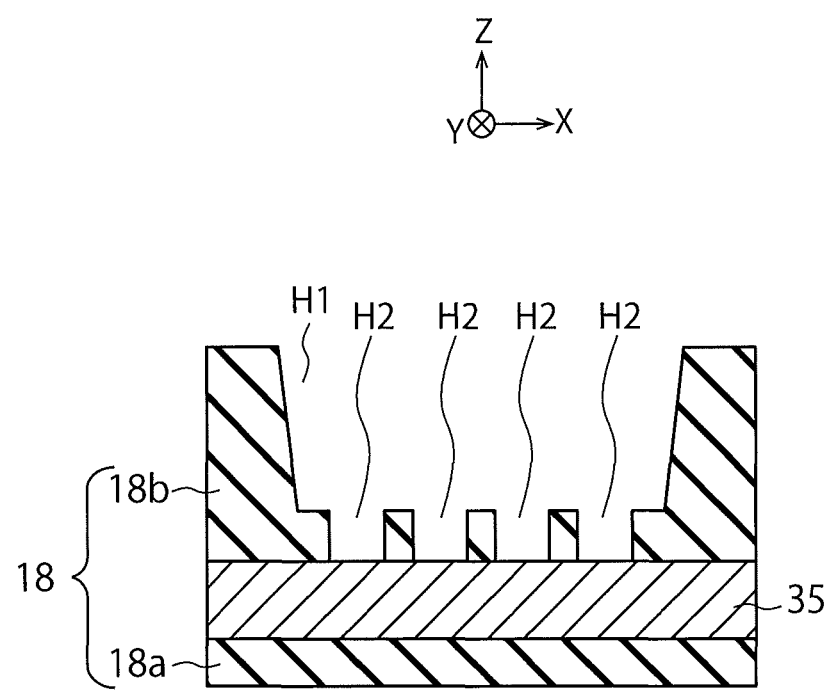
FIG. 16 is a cross-sectional view illustrating a method of manufacturing a semiconductor device of a third embodiment.

FIG. 16 is a cross-sectional view illustrating a method of manufacturing a semiconductor device of a third embodiment.

FIG. 16 illustrates a modification of the step of FIG. 6B. In this manner, a plurality of holes H2 are formed on the bottom of the hole H1 in the embodiment. Steps thereafter can be performed in a similar manner to the steps of FIG. 6C to FIG. 7B. For example, the catalyst layer 61 is formed in each of the holes H1, and the plating layer is grown from the position of the catalyst layer 61 in each of the holes H1. As a result, the metal pad 37 having a plurality of via-plugs 36 provided on the bottom face is formed.

The shape of the hole H2 of the embodiment can be applied to the hole H4 of the second embodiment.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first chip that includes a first interconnect layer, a first insulator provided on the first interconnect layer, a first metal portion provided on the first interconnect layer and provided in the first insulator and including at least one of palladium, platinum and gold, and a second interconnect layer provided on the first metal portion and provided in the first insulator, and
a second chip that includes a second insulator provided on the first insulator, and a third interconnect layer provided in the second insulator and provided on the second interconnect layer,
wherein the first metal portion is provided between a lower face of the second interconnect layer and an upper face of the first interconnect layer, is not provided between the first insulator and the upper face of the first interconnect layer, and is in contact with the upper face of the first interconnect layer.

2. The device of claim 1, wherein the second chip further includes a second metal portion provided on the third interconnect layer and provided in the second insulator and including at least one of palladium, platinum and gold, and a fourth interconnect layer provided on the second metal portion.

3. The device of claim 1, wherein the first interconnect layer includes at least tungsten or aluminum, and the second interconnect layer includes at least copper.

4. The device of claim 3, wherein the second interconnect layer further includes at least one of nickel and manganese.

5. The device of claim 1, wherein the second interconnect layer includes:
a first region provided on the first interconnect layer via the first metal portion; and
a second region provided on the first interconnect layer via the first metal portion and the first region, and provided on the first interconnect layer via the first insulator.

6. The device of claim 1, wherein the second interconnect layer includes:
a first film provided on a side face of the first insulator; and
a second film provided in the first insulator via the first film, and provided on the first interconnect layer via the first metal portion.

7. The device of claim 6, wherein the first film includes at least titanium, tantalum or manganese.

8. The device of claim 6, wherein the second film includes at least copper.

9. The device of claim 6, wherein the second film includes a metallic element that is different from a metallic element included in the first interconnect layer.

10. The device of claim 6, wherein the second film is in contact with the first metal portion.

11. A semiconductor device comprising:
a first chip that includes a first interconnect layer, a first insulator provided on the first interconnect layer, a second insulator provided on the first insulator, a third insulator provided on the second insulator, a first metal portion provided on the first interconnect layer and provided in the first insulator and including at least one of palladium, platinum and gold, and a second interconnect layer provided on the first metal portion and provided in the first, second and third insulators, and
a second chip that includes a fourth insulator provided on the third insulator, and a third interconnect layer provided in the fourth insulator and provided on the second interconnect layer,
wherein the first metal portion is provided between a lower face of the second interconnect layer and an upper face of the first interconnect layer, is not provided between the first insulator and the upper face of the first interconnect layer, and is in contact with the upper face of the first interconnect layer, and
wherein the second interconnect layer includes:
a first film provided on a side face of the first insulator;
a second film provided on a side face of the third insulator; and
a third film provided in the first insulator via the first film, provided on an upper face of the second insulator, provided in the third insulator via the second film, and provided on the first interconnect layer via the first metal portion.

12. The device of claim 1, wherein the first metal portion is in contact with the lower face of the second interconnect layer.

13. The device of claim 11, wherein the first metal portion is in contact with the lower face of the second interconnect layer.

* * * * *